United States Patent
Couet et al.

(10) Patent No.: US 7,805,118 B2
(45) Date of Patent: Sep. 28, 2010

(54) SATELLITE RECEIVING METHOD AND SYSTEM

(75) Inventors: Jean-Yves Couet, Saint Martin le Vinoux (FR); Anis Ben Abdallah, Ben Arous (TN)

(73) Assignee: STMicroelectronics SA, Montrouge (FR)

( * ) Notice: Subject to any disclaimer, the term of this patent is extended or adjusted under 35 U.S.C. 154(b) by 923 days.

(21) Appl. No.: 11/082,185

(22) Filed: Mar. 16, 2005

(65) Prior Publication Data

US 2005/0250441 A1 Nov. 10, 2005

(30) Foreign Application Priority Data

Mar. 16, 2004 (FR) .................................. 04 02709

(51) Int. Cl.
*H04B 1/18* (2006.01)
(52) U.S. Cl. .............. 455/192.1; 455/67.11; 455/67.14; 455/76; 455/182.1; 455/182.2; 455/182.3; 455/192.2; 455/192.3; 348/731; 348/735; 375/147; 375/344
(58) Field of Classification Search ................. 455/164, 455/76, 146, 147, 182.1–186.2, 192.1–192.3, 455/164.1–165.1, 207–209, 260, 264, 313–316, 455/67.11, 67.14, 67.15, 67.7, 115.1, 115.2, 455/115.4, 226.1, 226.4; 375/327, 344, 326, 375/339, 342, 373, 362, 376, 226; 331/1 A, 331/1 R, 2, 10, 11, 16, 18, 34, 36 C, 41, 48; 327/113–119, 141, 144, 155, 356, 360, 361
See application file for complete search history.

(56) References Cited

U.S. PATENT DOCUMENTS 4,121,170 A * 10/1978 Hartmann et al. ........... 331/1 A (Continued)

FOREIGN PATENT DOCUMENTS

DE 198 15 953 9/1999

(Continued)

*Primary Examiner*—Edward Urban
*Assistant Examiner*—Junpeng Chen
(74) *Attorney, Agent, or Firm*—Lisa K. Jorgenson; Jon A. Gibbons; Fleit Gibbons Gutman Bongini & Bianco P.L.

(57) ABSTRACT

A satellite receiving system (200, 300) and a method for adjusting a satellite receiving system include an input (113); a first oscillator (106) with theoretical frequency ($F_{OSC1}$) and real frequency ($F_{OSC1}'$), a first frequency mixer (105) delivering a signal at a first intermediate frequency ($F_2$), a second oscillator (302) with frequency ($F_{OSC2}$), a second frequency mixer (301) delivering a signal at a second intermediate frequency ($F_{OUT}$), a microcontroller (202), which controls a real frequency ($F_{VCO}$) of the second oscillator, and an output (110). An external signal (112) at a determined frequency ($F_1$) is supplied to the input (113). A nominal value ($F_{OSC2}$) of the frequency of the second oscillator is determined as a function of the input frequency ($F_1$), the theoretical frequency ($F_{OSC1}$) of the first oscillator and the second intermediate frequency ($F_{OUT}$). The frequency of the second oscillator is controlled, via the microcontroller, at the determined nominal value. An offset is detected between the theoretical frequency ($F_{OSC1}$) and the real frequency ($F_{OSC1}'$) of the first oscillator, from an offset between the first intermediate frequency ($F_2$) and the second intermediate frequency ($F_{OUT}$) at the output (110). The offset is corrected by changing the nominal frequency ($F_{OSC2}$) of the second oscillator to a real frequency ($F_{VCO}$) so as to cancel the offset at the output.

15 Claims, 3 Drawing Sheets

U.S. PATENT DOCUMENTS

| | | | | |
|---|---|---|---|---|
| 4,575,761 A | * | 3/1986 | Carlson et al. | 348/731 |
| 4,642,573 A | * | 2/1987 | Noda et al. | 329/308 |
| 4,817,195 A | * | 3/1989 | Kubo et al. | 455/192.2 |
| 4,855,835 A | * | 8/1989 | Tobita | 348/735 |
| 4,856,085 A | * | 8/1989 | Horvat | 455/315 |
| 4,959,872 A | * | 9/1990 | Imai et al. | 455/164.1 |
| 5,271,039 A | * | 12/1993 | Suzuki | 375/327 |
| 5,493,710 A | * | 2/1996 | Takahara et al. | 455/192.2 |
| 5,542,114 A | * | 7/1996 | Kojima et al. | 455/196.1 |
| 5,737,694 A | * | 4/1998 | McMahill et al. | 455/76 |
| 5,875,388 A | * | 2/1999 | Daughtry et al. | 455/67.11 |
| 5,900,751 A | * | 5/1999 | Kuwabara | 327/113 |
| 6,052,419 A | * | 4/2000 | Hioki | 375/344 |
| 6,154,640 A | * | 11/2000 | Itoh et al. | 455/76 |
| 6,678,012 B1 | * | 1/2004 | Belotserkovsky | 348/731 |
| 6,882,680 B1 | * | 4/2005 | Oleynik | 375/147 |
| 7,289,779 B2 | * | 10/2007 | Bienek et al. | 455/147 |

FOREIGN PATENT DOCUMENTS

| | | |
|---|---|---|
| EP | 1 067 689 | 1/2001 |

* cited by examiner

SATELLITE RECEIVING METHOD AND SYSTEM

CROSS-REFERENCE TO RELATED APPLICATIONS

This application is based upon and claims priority from prior French Patent Application No. 0402709, filed on Mar. 16, 2004 the entire disclosure of which is herein incorporated by reference.

FIELD OF THE INVENTION

The present invention generally relates to satellite receiving installations, and more particularly to the adjustment of the oscillation frequency of the radio-frequency (RF) oscillators in these installations.

BACKGROUND OF THE INVENTION

In wireless transmission, the physical aspects of the electromagnetic wave are the same when the transmission takes place by satellite or by land. However, transmission by satellite is carried out at much higher frequencies than transmission by land. Unlike the signals picked up by a terrestrial antenna which can be transmitted directly to the terminal, the signals picked up by a satellite antenna have too high a carrier frequency to be transmitted directly to the terminal. It is therefore necessary to lower the carrier frequency in order for it to be compatible with the frequency band of the tuner of a terminal. This is one of the functions of a front end of a receiving antenna of a satellite receiving installation or LNB (Low Noise Block downconverter).

The tuner of a terminal is capable of using the frequencies contained in a frequency band of, for example, 950-2150 MHz, whereas the frequency band used for satellite transmission is typically 10.7-12.75 GHz. In order to transpose the satellite transmission frequency band into a frequency band usable by a terminal, an LNB incorporates one or more local oscillators. Such local oscillators have an oscillation frequency used for offsetting the satellite transmission frequency band. Given that the satellite transmission frequency band is broader than the frequency band used by the terminal, a first and a second local oscillator are conventionally used in the LNB. Thus, the satellite transmission frequency band is divided into two frequency sub-bands. Each of the sub-bands is processed using one of the two local oscillators whose oscillation frequencies generally have respective values of 9750 MHz and 10600 MHz. Consequently, such an LNB converts the 10700-127500 MHz input frequency band into 950-2150 MHz in the following manner:

- a first mixer mixes the oscillation frequency supplied by the first local oscillator with the low frequency of the input frequency band (10700−9750=950 MHz); and
- a second mixer mixes the oscillation frequency supplied by the second oscillator with the high frequency of the input frequency band (12750−10600=2150 MHz).

The accuracy and stability of the oscillation frequency of the local oscillators incorporated in the LNBs are essential factors for guaranteeing good satellite reception. This is because the present demodulators do not have the ability to pick up a channel carried by a determined frequency when this channel is in reality carried by a frequency which has an offset of more than approximately 4 MHz with respect to this determined frequency. Consequently, the minimum accuracy required for the signal at the output of the LNB is of the order of +/−2 MHz.

Furthermore, the manufacture of a local oscillator having an oscillation frequency of the order of 10,000 MHz and of high accuracy is very expensive. LNB manufacturers therefore use oscillators with a relatively low accuracy but having relatively accurate means of adjusting the oscillation frequency in order to correct any frequency offset between a theoretical value and a real value of oscillation frequency. Conventionally, adjustment of the oscillation frequency is carried out in the factory before the LNB is sealed. Each local oscillator comprises a mechanically deformable cavity. A specific component, such as a screw for example, generally allows adjustment of the oscillation frequency by varying the depth of penetration of the component into the cavity. In a variant, the adjustment is obtained by deformation of the oscillation cavity. This type of mechanical adjustment can be carried out manually or automatically.

A local oscillator generally has an adjustment scale of the order of +/−40 MHz with respect to a given frequency. This adjustment must be carried out independently for each local oscillator present in the LNB. Therefore two such adjustments are necessary for a conventional LNB comprising two local oscillators.

FIG. 1 illustrates a conventional system allowing such an adjustment in the factory before sealing of the LNB referenced 100. In order to simplify understanding, the LNB 100 depicted comprises a single antenna 103 and a single local oscillator 106. An external signal 112 of frequency $F_1$ is generated by a signal generator 101 and transported by a wave guide 102. The signal 112 simulates an external satellite signal received at the input of the LNB 100. The signal 112 is picked up by the antenna 103 and then amplified by an amplifier 104. The signal thus amplified is processed by the mixer 105 which receives on a first input a signal supplied by the local oscillator 106 at an oscillation frequency with theoretical value $F_{OSC}$, and on a second input the external signal 112 of frequency $F_1$. In practice, as described above, the oscillator supplies a frequency with real value $F_{OSC}'$ which may be affected by an offset with respect to the theoretical frequency with an offset value $\Delta F$ calculated with the following equation:

$$\Delta F = |F_{OSC}' - F_{OSC}|$$

The local oscillator 106 comprises a cavity, and a screw 107 going down into the cavity for adjusting the oscillation frequency. The frequency $F_2$ is related to the frequency $F_1$ of the external signal 112 in such a way that:

$$F_2 = F_1 - F_{OSC}$$

The signal at the output of the mixer 105 is amplified by an amplifier 109 and then transmitted as the output signal $S_{out}$, via an output 110 of the LNB 100, to a spectrum analyzer 111. The latter analyzes the frequency of the output signal $S_{out}$, that is to say the frequency $F_2$.

The frequency $F_2$ is then compared to a frequency $F_{OUT}$ of predetermined target value. The value of the frequency $F_2$ is determined as a function of the value of the frequency $F_1$ and the theoretical value of the frequency $F_{OSC}$ by the following equation:

$$F_{OUT} = F_1 - F_{OSC}$$

The screw 107 is manipulated in order to adjust the oscillation frequency $F_{OSC}'$ of the local oscillator so that the frequency $F_2$ is equal to the frequency $F_{OUT}$ of predetermined value expected at the output of the LNB. When the adjustment of all the local oscillators of the LNB has been carried out, the LNB is sealed.

This adjustment although useful has several drawbacks. One drawback includes local oscillators having a deformable cavity which must be manually tuned with a screw. This requires expensive manipulation at the cavity and adjustment validation. In addition, this adjustment is typically only performed in the factory and before sealing of the LNB.

Accordingly, a need exists to overcome the drawbacks and shortcomings of the prior art and to provide a local oscillator without a cavity having specific mechanical characteristics.

SUMMARY OF THE INVENTION

The present invention overcomes the drawbacks and shortcomings of the prior art. The present invention is advantageous for manufacturers and users to have an LNB (Low Noise Block downconverter) supplying a frequency which is accurate, easy to adjust in the factory at the time of manufacture and capable of being adjusted at any time during the life of the LNB, even after the LNB has been sealed.

A first aspect of the invention provides a method for adjusting a receiving system in a satellite receiving installation, the receiving system including:
   an input for receiving an external signal at a satellite frequency;
   a first local oscillator for generating a first transposition signal at a given oscillation frequency, having a determined theoretical value and a real value different from the theoretical value;
   a first frequency mixer having a first input coupled to the input of the system for receiving the external signal, a second input receiving the first transposition signal, and an output delivering a signal at a first intermediate frequency;
   a second local oscillator for generating a second transposition signal at an oscillation frequency having a determined nominal value;
   a second frequency mixer having a first input coupled to the output of the first mixer for receiving the signal at the first intermediate frequency, a second input receiving the second transposition signal, and an output delivering a signal at a second intermediate frequency of determined target value;
   a microcontroller or similar, which controls a real value of the oscillation frequency of the second transposition signal; and,
   an output coupled to the output of the second mixer, for receiving the signal at the second intermediate frequency;
   the method comprising the following steps:
   supplying an external signal at an input frequency of determined known value, to the input of the receiving system;
   determining the nominal value of the oscillation frequency of the second transposition signal as a function of the known value of the input frequency, the theoretical value of the oscillation frequency of the first transposition signal, and the target value of the second intermediate frequency;
   controlling, via the microcontroller, the oscillation frequency of the second local oscillator at the nominal value determined at the previous step;
   detecting a practical offset between the theoretical value and the real value of the oscillation frequency of the first local oscillator, from an offset between the second intermediate frequency and the target frequency noted at the output of the receiving system;
   correcting the practical offset by correcting, via the microcontroller, the nominal value of the oscillation frequency of the second local oscillator into a real frequency value so as to cancel out the offset noted at the output.

A second aspect of the present invention provides a method for receiving a satellite signal using a satellite receiving installation as defined in the first aspect, wherein the microcontroller performs the correction of the offset value continuously.

A third aspect of the invention proposes a system for receiving a satellite external signal, intended to be used in a satellite receiving installation, the system comprising:
   an input for receiving an external signal at a satellite frequency;
   a first local oscillator for generating a first transposition signal at a given oscillation frequency, having a determined theoretical value and a determined real value, different from the theoretical value;
   a first frequency mixer having a first input coupled to the input of the system for receiving the external signal, a second input receiving the first transposition signal, and an output delivering a signal at a first intermediate frequency;
   a second local oscillator for generating a second transposition signal at an oscillation frequency having a determined nominal value;
   a second frequency mixer having a first input coupled to the output of the first mixer for receiving the signal at the first intermediate frequency, a second input receiving the second transposition signal, and an output delivering a signal at a second intermediate frequency of determined target value;
   a microcontroller or similar, which controls a real value of the oscillation frequency of the second transposition signal; and,
   an output coupled to the output of the second mixer, for receiving the signal at the second intermediate frequency;
   in which the microcontroller contains in memory a correction coefficient for controlling the real value of the oscillation frequency of the second transposition signal as described in the first aspect.

The foregoing and other aspects, features, and advantages of the present invention are apparent from a reading of the description of one of the embodiments, given hereinafter with reference to the accompanying drawings.

BRIEF DESCRIPTION OF THE DRAWINGS

The subject matter, which is regarded as the invention, is particularly pointed out and distinctly claimed in the claims at the conclusion of the specification. The foregoing and other features, and advantages of the invention will be apparent from the following detailed description taken in conjunction with the accompanying drawings in which:

DESCRIPTION OF THE PREFERRED EMBODIMENTS

It should be understood that these embodiments are only examples of the many advantageous uses of the innovative teachings herein. In general, statements made in the specification of the present application do not necessarily limit any of the various claimed inventions. Moreover, some statements may apply to some inventive features but not to others. In general, unless otherwise indicated, singular elements may be in the plural and vice versa with no loss of generality.

Figure 1:
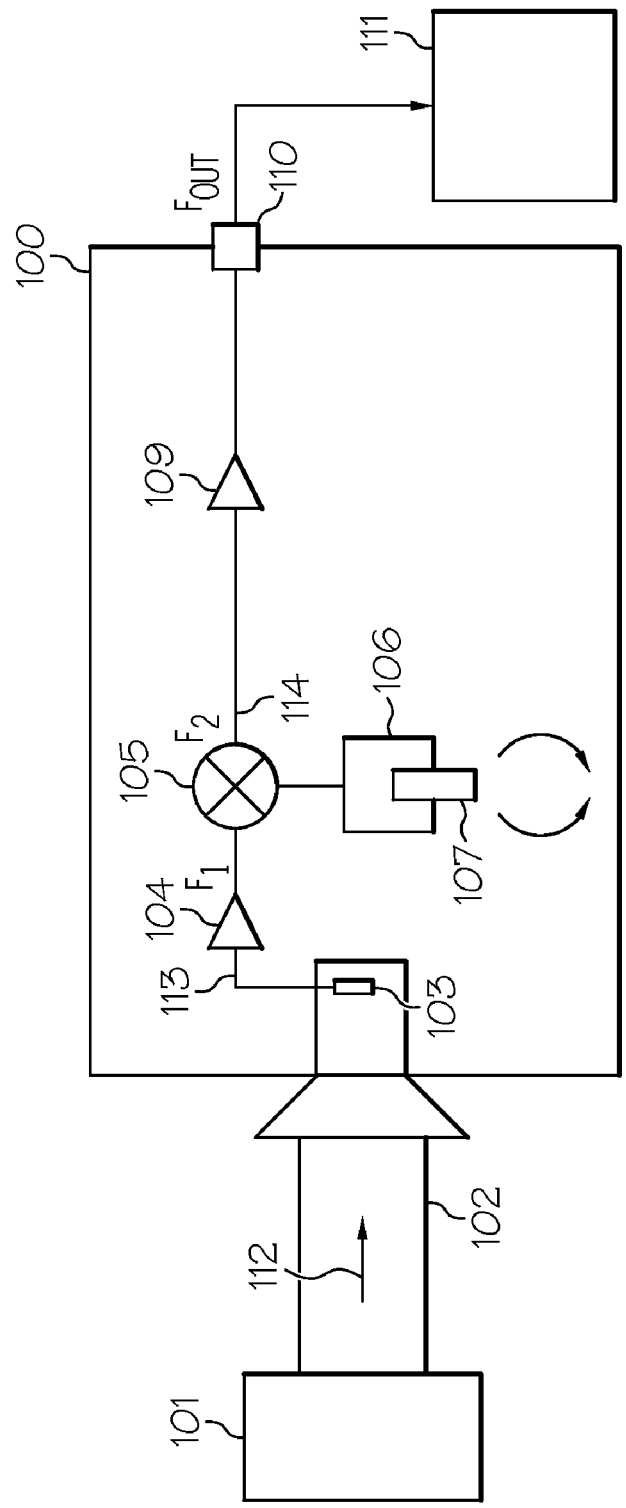
FIG. 1 is a block diagram illustrating a prior art LNB (Low Noise Block downconverter) and a method of adjusting same.
Figure 2:
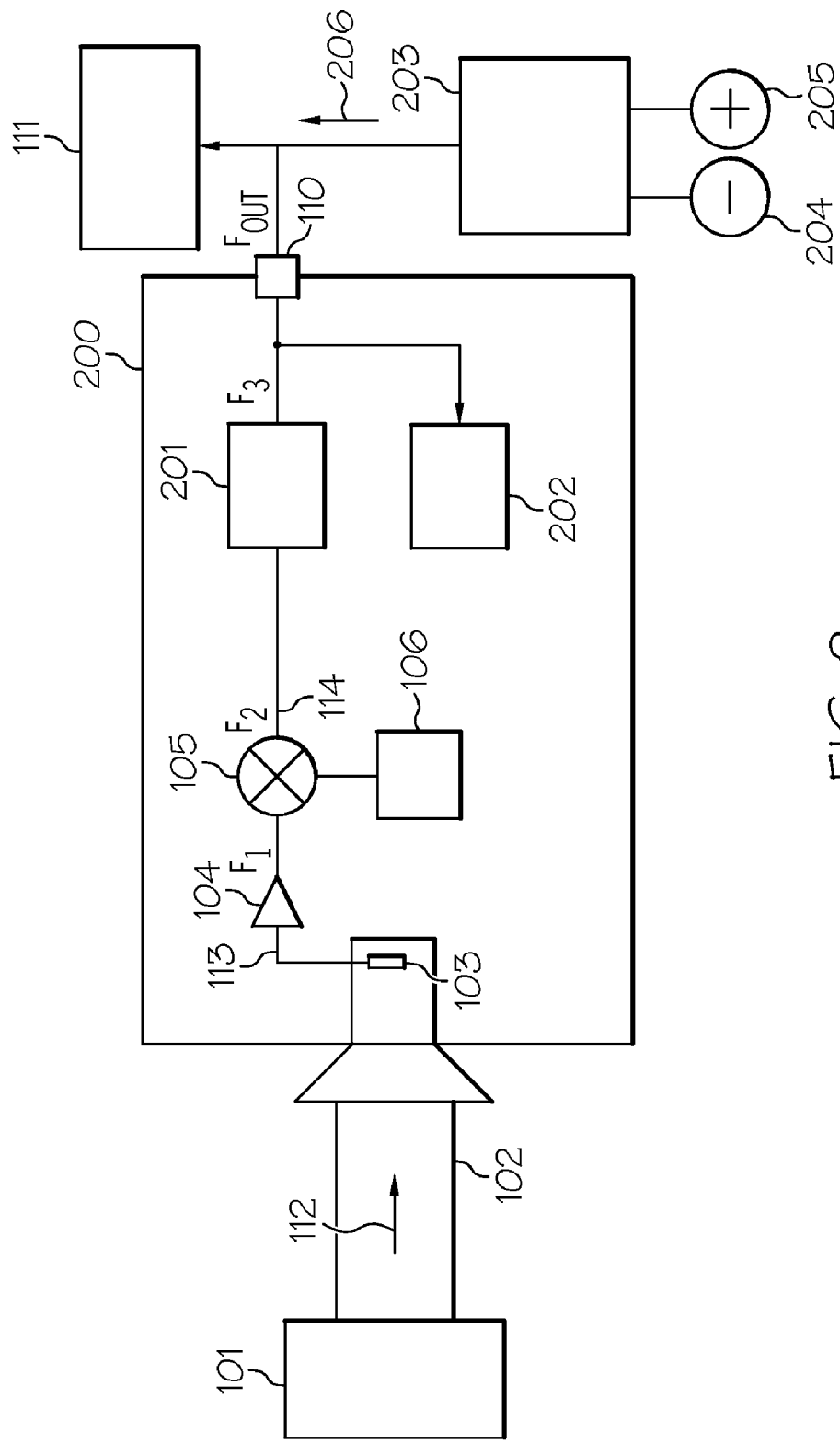
FIG. 2 is a block diagram illustrating an LNB according to one embodiment of the present invention within an installation allowing the implementation of an adjustment method according to one embodiment of the present invention.

FIG. 2 illustrates an LNB (Low Noise Block downconverter) 200 according to one embodiment of the invention within an installation allowing the implementation of an adjustment method according to one embodiment of the invention.

The LNB 200 comprises a local oscillator 106, preferably simple with no deformable cavity, having an oscillation frequency of relatively low accuracy. It also comprises a frequency mixer 105 which receives on a first input a signal supplied by the local oscillator 106 at an oscillation frequency with theoretical value $F_{OSC}$, and which receives on a second input the external signal 112 of frequency $F_1$. The frequency mixer 105 supplies at the output 114 a signal of intermediate frequency $F_2$.

The LNB 200 also comprises a signal frequency correction unit 201 transposing the signal at the intermediate frequency $F_2$ into a signal at another intermediate frequency $F_{OUT}$. Typically, the frequency $F_{OUT}$ has a value lower than the frequency $F_2$, but this is not mandatory. A microcontroller 202 is connected to the frequency correction unit 201.

The LNB 200 is connected at the input to a signal generator 101 by a wave guide 102 and at the output to a spectrum analyzer 111 and to a specific adjustment apparatus 203 comprising controls 204 and 205. Such an adjustment apparatus is conventional and well known to persons skilled in the art.

An installation of this type illustrates a system for implementing an adjustment method according to one embodiment of the invention.

The objective of such an adjustment is to correct the offset $\Delta F$ of the theoretical value of the frequency $F_{OSC}$ supplied by the local oscillator 106 with respect to the real value of the frequency $F_{OSC}'$ actually supplied by the local oscillator 106 by controlling the frequency correction unit 201. Such an offset is due to the low accuracy of the oscillation frequency of the local oscillator 106, as described previously.

To this end, an external signal $S_{in}$ of satellite frequency $F_1$ is generated by the signal generator 101, and is processed by the frequency mixer 105 as described previously. At the output of the LNB 200, a signal of frequency $F_{OUT}$ is transmitted to the spectrum analyzer 111. On the basis of the comparison of the frequency $F_{OUT}$ of a signal at the output of the LNB 200 and a predetermined target value of the frequency $F_{OUT}$, which is calculated as a function in particular of the value of the frequency $F_1$ and the theoretical value of the oscillation frequency $F_{OSC1}$, as described previously, the specific adjustment apparatus 203 controls the frequency correction unit 201 in order to transpose the frequency $F_{OUT}$ so that it is equal to the predetermined target frequency. The controls can be implemented either manually by pressing the keys 204 and 205, or automatically using a computer program.

The specific adjustment apparatus 203 calculates a correction coefficient to be transmitted to the frequency correction unit 201 for correcting the offset between the theoretical value of the oscillation frequency and the real value of the oscillation frequency actually supplied by the local oscillator 106. This correction coefficient can be transmitted from the specific adjustment apparatus 203 to the microcontroller 202 via the Digital Satellite Equipment Control (DiSEqC™) protocol commonly used in satellite receiving installations and well known to persons skilled in the art.

Figure 3:
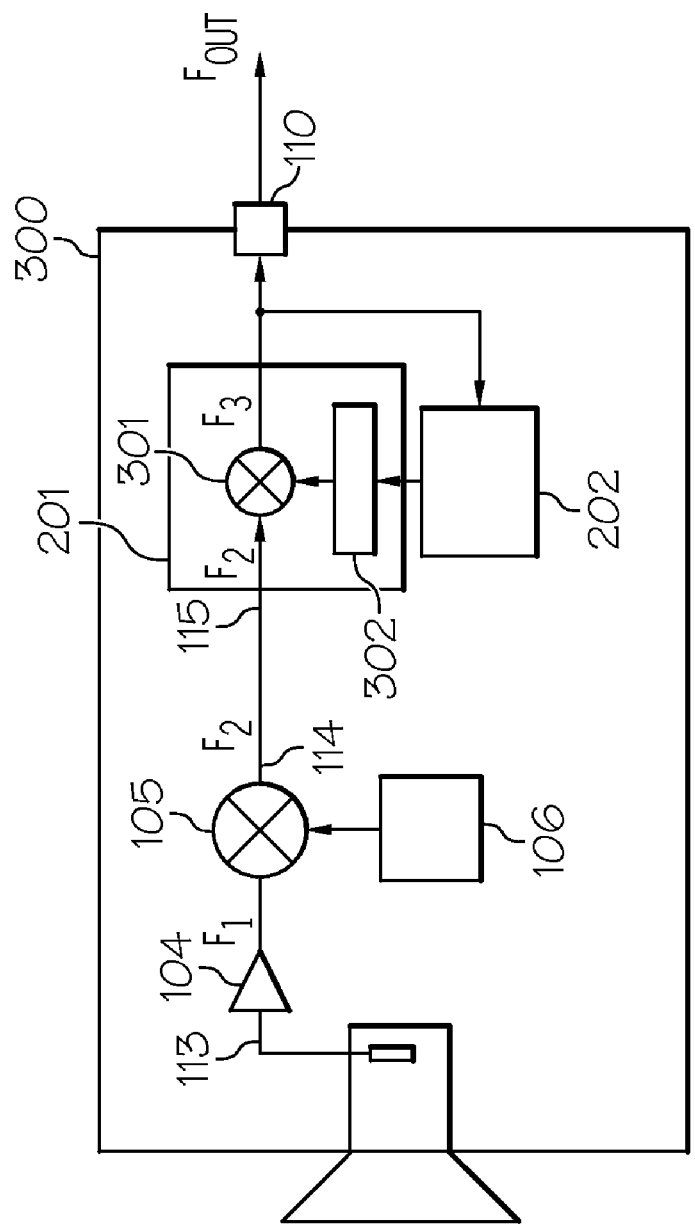
FIG. 3 is a block diagram illustrating an LNB according to one embodiment of the invention.

FIG. 3 illustrates LNB 300, an embodiment of the invention in which the frequency correction unit 201 comprises a frequency mixer 301 which receives on a first input a signal of frequency $F_{VCO}$ supplied by a voltage-controlled oscillator 302 with a minimum accuracy of 2 MHz, and on a second input the signal of frequency $F_2$. Such an accurate oscillator is preferably a quartz oscillator. Consequently, the offset, which could appear between a required value and a real value of the frequency of the voltage-controlled oscillator 302, would remain negligible compared with the offset between the theoretical value $F_{OSC}$ and the real value $F_{OSC}'$ of the local oscillator 106.

Thus, the frequency $F_{OUT}$ of the signal at the output of the LNB 300 is obtained for example with the following equation:

$$F_{OUT} = F_{VCO} - F_2$$

An LNB 300 according to one embodiment of the invention comprises a first local oscillator 106 which supplies a signal with a frequency of theoretical value $F_{OSC}$ and of real value $F_{OSC}'$ to the mixer 105, and a second local oscillator 302 which supplies a signal of frequency $F_{VCO}$.

It therefore appears clearly that the frequency $F_{OUT}$ of the signal at the output of the LNB 300 can be adjusted by means of the frequency $F_{VCO}$ supplied by the voltage-controlled oscillator 302, the aim of this adjustment being to correct the frequency offset between the theoretical value of the oscillation frequency $F_{OSC}$ and the real value of the oscillation frequency $F_{OSC}'$.

The following section describes a numerical example of the implementation of one embodiment of the invention. Assuming numerical values, there is deduced therefrom the corrective coefficient to be applied to the frequency correction unit 201 in order to correct the effect of a frequency offset of the frequency supplied by the first local oscillator 106.

Taking as an assumption an external signal frequency F1 with a value 11000 MHz and a frequency $F_{OSC}$ of the first oscillator 106 with a theoretical value 9800 MHz, the target value of the frequency $F_{OUT}$ of the signal at the output of the LNB 300 is expected to be equal to 1200 MHz. Furthermore, the first oscillator supplies a frequency with an accuracy of +/−20 MHz.

In order to determine the real value $F_{OSC}'$ of the oscillation frequency actually supplied by this first oscillator, the frequency $F_{OUT}$ of the signal at the output of the LNB 300 is measured with the spectrum analyzer 111 in the absence of frequency correction, that is to say for a null frequency $F_{VOC}$. If there is obtained under such conditions:

$$F_2 = F_{OUT} = 1220 \text{ MHz}.$$

The real value of the oscillation frequency actually supplied by the oscillator $F_{OSC}'$ is therefore equal to 9780 MHz.

In the following equation, $\Delta F$ represents the frequency offset:

$$\Delta F = F_{OSC} - F_{OUT} = 20 \text{ MHz}$$

A correction coefficient is deduced therefrom.

The calculated correction coefficient is sent to the microcontroller 202 which stores it. Next, the microcontroller controls the frequency correction unit 201 in order to apply the coefficient thus calculated to the signal of frequency $F_2$.

The preceding sections have described an adjustment method according to one embodiment of the invention. It is advantageous to apply such a method before an installation is brought into operation.

After such an installation is brought into operation, the microcontroller controls the local oscillator 302 in accordance with the correction coefficient previously calculated and stored.

The preceding description describes one embodiment of the present invention, taking into account an LNB comprising one local oscillator 106. It is important to note that the invention covers embodiments with an LNB comprising several local oscillators. In this case, an LNB preferably comprises as many voltage-controlled local oscillators 302 as local oscillators 106. These voltage-controlled local oscillators 302 are advantageously controlled by a single microcontroller.

It is also important to note that such an adjustment can be carried out both when the LNB is not yet sealed and when it is already sealed. For this reason, the present invention therefore makes it possible to carry out adjustments at any stage whatsoever of the construction and use of such a satellite receiving installation.

Moreover, the present invention provides an LNB which offers great ease of adjustment. An adjustment method according to the invention can advantageously be automated and carried out simultaneously on the local oscillators 106 of the same LNB by means of a single connection to the specific adjustment apparatus 203.

Furthermore, the French patent 2 835 368 entitled "Transmission de signaux sur un cable coaxial", which is hereby incorporated by reference in its entirety describes a receiver advantageously provided with an offsetting and filtering functionality which makes it possible to extract useful signals from different signals and combine them in order to transmit them simultaneously via one and the same coaxial cable. Thus, an LNB provided with such functionality is capable of simultaneously supplying, to a requesting processing unit, useful external signals originating from different signals through a single coaxial cable. This functionality is based on a system comprising a satellite channel router (SCR) and a band pass filter (BPF). A satellite channel router comprises a frequency mixer for offsetting the carrier frequency of the useful signal operating on a predetermined frequency.

An embodiment of the present invention has been shown advantageously and easily be implemented in an installation comprising one or more satellite channel routers. Satellite channel routers are then also used for performing a voltage offset correction between a theoretical value and a real value of oscillation frequency of a local oscillator 106. In this case, the voltage-controlled local oscillator 302 has an initial nominal oscillation value $F_{OSC2}$ used for the voltage offset of a satellite channel router. A target value of the output frequency $F_{OUT}$ of the LNB is next determined as a function of the frequency of the satellite signal, the theoretical value of the frequency of the local oscillator 106 and the predetermined frequency. Then the correction is performed as described previously by transposing the frequency $F_{OUT}$ of the signal at the output of the LNB onto the frequency with target value $F_{OUT}$.

Although a specific embodiment of the invention has been disclosed, it will be understood by those having skill in the art that changes can be made to this specific embodiment without departing from the spirit and scope of the invention. The scope of the invention is not to be restricted, therefore, to the specific embodiment, and it is intended that the appended cover any and all such applications, modifications, and embodiments within the scope of the present invention.

What is claimed is:

1. A method for adjusting a receiving system in a satellite receiving installation, the method comprising:

receiving, at an input of a receiving system, an external signal at a satellite frequency;

generating, with a first oscillator, a first transposition signal at an oscillation frequency having a theoretical value and a real value different from the theoretical value;

mixing the external signal and the first transposition signal with a first frequency mixer having a first input coupled to the input of the system, a second input receiving the first transposition signal, and an output delivering a first intermediate signal at a first intermediate frequency;

generating, with a second oscillator, a second transposition signal at an oscillation frequency having a nominal value;

mixing the first intermediate signal and the second transposition signal at a second frequency mixer having a first input coupled to the output of the first mixer for receiving the first intermediate signal, a second input receiving the second transposition signal, and an output delivering a signal at a second intermediate frequency; and controlling, with a microcontroller and with signals generated by only two oscillators, a real value of the oscillation frequency of the second transposition signal by:

determining the nominal value of the oscillation frequency of the second transposition signal as a function of: (i) a given predetermined value of the frequency of the external signal, (ii) the theoretical value of the oscillation frequency of the first transposition signal, and (iii) a target value of the second intermediate frequency;

controlling, via the microcontroller, the oscillation frequency of the second oscillator at the nominal value previously determined;

detecting, with the microcontroller, a practical offset between the theoretical value and the real value of the oscillation frequency of the first oscillator, from an offset between the first intermediate frequency and the second intermediate frequency previously determined at an output of the receiving system; and correcting, with the microcontroller, the practical offset by changing the nominal value of the oscillation frequency of the second oscillator to a real value to cancel the offset determined at the output of the receiving system.

2. A system for receiving a satellite external signal, intended to be used in a satellite receiving installation, the system comprising:

an input for receiving an external signal at a satellite frequency;

a first oscillator for generating a first transposition signal at a given oscillation frequency, having a determined theoretical value and a determined real value, different from the theoretical value;

a first frequency mixer having a first input coupled to the input of the system for receiving the external signal, a second input receiving the first transposition signal, and an output delivering a signal at a first intermediate frequency;

a second oscillator for generating a second transposition signal at an oscillation frequency having a determined nominal value;

a second frequency mixer having a first input coupled to the output of the first mixer for receiving the signal at the first intermediate frequency, a second input receiving the second transposition signal, and an output delivering a signal at a second intermediate frequency of a determined target value; and a microcontroller which controls a real value of the oscillation frequency of the second transposition signal, the microcontroller comprising:

means for determining the nominal value of the oscillation frequency of the second transposition signal as a function of: (i) a given predetermined value of the input frequency, (ii) the theoretical value of the oscillation frequency of the first transposition signal, and (iii) a target value of the second intermediate frequency;

means for controlling, via the microcontroller, the oscillation frequency of the second oscillator at the nominal value previously determined;

means for detecting a practical offset between the theoretical value and the real value of the oscillation frequency of the first oscillator, from an offset between the first intermediate frequency and the second intermediate frequency previously determined at the output of the system; and means for correcting the practical offset, via the microcontroller, by correcting the nominal value of the oscillation frequency of the second oscillator into a real frequency value so as to cancel out the offset determined at the output of the system, wherein the system includes only two oscillators for controlling the real value of the oscillation frequency of the second transposition signal.

3. The system according to claim 2, wherein the correcting the practical offset further comprises:

calculating a correction coefficient for the oscillation frequency of the second oscillator by means of a device external to the receiving system;

sending the correction coefficient to the microcontroller via a determined control protocol;

storing of the correction coefficient by the microcontroller; and controlling of the second oscillator by the microcontroller according to the correction coefficient.

4. The system according to claim 3, wherein the second oscillator is a voltage-controlled oscillator controlled by the microcontroller.

5. The system according to claim 3, wherein the step of correcting the practical offset is carried out manually by an operator by means of a device external to the receiving system.

6. The system according to claim 3, wherein the step of correcting is executed automatically by software by means of a device external to the receiving system.

7. The system according to claim 3, wherein the microcontroller performs the correcting of the practical offset value continuously.

8. The system according to claim 2, wherein the second oscillator is a voltage-controlled oscillator controlled by the microcontroller.

9. The system according to claim 2, further comprising:
a band pass filter at the output of the second frequency mixer and wherein there are further carried out a frequency offset by means of the second mixer by modifying the value of the nominal frequency and filtering by means of the band pass filter in order to transmit part of the satellite external signal to a terminal.

10. The system according to claim 8, further comprising:
a band pass filter at the output of the second frequency mixer and wherein there are further carried out a frequency offset by means of the second mixer by modifying the value of the nominal frequency ($F_{OSC2}$) and filtering by means of the band pass filter in order to transmit part of the satellite external signal to a terminal.

11. The system according to claim 2, further comprising a down converter.

12. A satellite receiver system comprising:
a low noise block down converter for receiving a satellite external signal, intended to be used in a satellite receiving installation, the low noise block down converter comprising:

an input for receiving an external signal at a satellite frequency;

a first oscillator for generating a first transposition signal at an oscillation frequency having a theoretical value and a real value different from the theoretical value;

a first frequency mixer having a first input coupled to the input of the system for receiving the external signal, a second input receiving the first transposition signal, and an output delivering a first intermediate signal at a first intermediate frequency;

a second oscillator for generating a second transposition signal at an oscillation frequency having a nominal value;

a second frequency mixer having a first input coupled to the output of the first mixer for receiving the signal at the first intermediate frequency, a second input receiving the second transposition signal, and an output delivering a signal at a second intermediate frequency; and a microcontroller that controls a real value of the oscillation frequency of the second transposition signal while using signals generated by only two oscillators, the microcontroller comprising:

means for determining the nominal value of the oscillation frequency of the second transposition signal as a function of: (i) a given predetermined value of the frequency of the external signal, (ii) the theoretical value of the oscillation frequency of the first transposition signal, and (iii) a target value of the second intermediate frequency;

means for controlling, via the microcontroller, the oscillation frequency of the second oscillator at the nominal value previously determined;

means for detecting a practical offset between the theoretical value and the real value of the oscillation frequency of the first oscillator, from an offset between the first intermediate frequency and the second intermediate frequency previously determined at an output of the system; and means for correcting the practical offset, via the microcontroller, by changing the nominal value of the oscillation frequency of the second oscillator to a real frequency value to cancel the offset determined at the output of the system, wherein the satellite receiver system includes only two oscillators for controlling the real value of the oscillation frequency of the second transposition signal.

13. The system according to claim 12, wherein the second oscillator is a voltage-controlled oscillator controlled by the microcontroller.

14. The system according to claim 12, further comprising:
a band pass filter at the output of the second frequency mixer and wherein there are further carried out a frequency offset by means of the second mixer by modifying the value of the nominal frequency and filtering by means of the band pass filter in order to transmit part of the satellite external signal to a terminal.

15. A method for adjusting a receiving system in a satellite receiving installation, the method comprising:

mixing at a first frequency mixer a first input of a satellite frequency (F1) with a second input of a first transposition signal at a first oscillation frequency ($F_{OSC}$) generated by a first oscillator, to produce at an output of the first frequency mixer at a first intermediate frequency (F2=$F_{OSC}$−F1);

mixing at a second frequency mixer a first input of the first intermediate frequency from the first frequency mixer (F2) with a second input of a second transposition signal ($F_{VCO}$) at a given second oscillation frequency generated by a second oscillator, to produce at an output of the second frequency mixer a second intermediate frequency (F3=$F_{VCO}$−F2);

setting, initially, with a microcontroller, the second oscillation frequency of the second oscillator to be a function of the second intermediate frequency ($F_{VCO}$=F3);

detecting, with the microcontroller, an offset ($F_{OSC}$−F1) between the second intermediate frequency (F3) and a difference between the satellite frequency (F1) and a sum of the first oscillation frequency ($F_{OSC}$) and the second transposition signal ($F_{VCO}$ with F1−$F_{OSC}$−$F_{VCO}$=>F1−($F_{OSC}$+$F_{VCO}$), where F3=$F_{VCO}$−F2, and where F2=$F_{OSC}$−F1 resulting in F3=$F_{VCO}$−($F_{OSC}$−F1)); and correcting, with the microcontroller and with signals generated by only two oscillators, the second oscillation frequency of the second oscillator so as to cancel out the offset ($F_{OSC}$−F1);

wherein the second oscillation frequency ($F_{VCO}$) has a minimum accuracy so that a required frequency of the second oscillator and an actual frequency of the second oscillator is at least an order of magnitude more accurate than the offset ($F_{OSC}$−F1) so that any difference between the required frequency of the second oscillator and the actual frequency of the second oscillator would remain negligible when compared to the offset ($F_{OSC}$−F1).

* * * * *